United States Patent
Tateda (10) Patent No.: US 9,910,536 B2
(45) Date of Patent: Mar. 6, 2018

(54) TOUCH SENSOR AND TOUCH PANEL DEVICE

(71) Applicant: POLYMATECH JAPAN CO., LTD., Saitama, Saitama (JP)

(72) Inventor: Shinya Tateda, Saitama (JP)

(73) Assignee: POLYMATECH JAPAN CO., LTD., Saitama (JP)

( * ) Notice: Subject to any disclaimer, the term of this patent is extended or adjusted under 35 U.S.C. 154(b) by 132 days.

(21) Appl. No.: 15/101,098

(22) PCT Filed: Dec. 5, 2014

(86) PCT No.: PCT/JP2014/082216
§ 371 (c)(1),
(2) Date: Jun. 2, 2016

(87) PCT Pub. No.: WO2015/083815
PCT Pub. Date: Jun. 11, 2015

(65) Prior Publication Data
US 2017/0003799 A1    Jan. 5, 2017

(30) Foreign Application Priority Data
Dec. 6, 2013    (JP) .................... 2013-253662

(51) Int. Cl.
*G06F 3/045* (2006.01)
*G06F 3/041* (2006.01)
(Continued)

(52) U.S. Cl.
CPC ........ *G06F 3/0416* (2013.01); *G06F 3/03547* (2013.01); *G06F 3/044* (2013.01);
(Continued)

(58) Field of Classification Search
CPC .... G06F 3/044; G06F 3/03547; G06F 3/0354; G06F 3/0412; G06F 3/0416; G06F 3/041; G06F 2203/0339; G06F 2203/04111
See application file for complete search history.

(56) References Cited

U.S. PATENT DOCUMENTS 4,264,903 A    4/1981    Bigelow
7,321,361 B2*  1/2008    Sato .................. G06F 3/0338
                                                    345/173
(Continued)

FOREIGN PATENT DOCUMENTS

JP    56-1438 A       1/1981
JP    2009-265970 A   11/2009
(Continued)

OTHER PUBLICATIONS

International Search Report for PCT Patent App. No. PCT/JP2014/082216 (dated Jan. 13, 2015) with English language translation.

*Primary Examiner* — Vijay Shankar
(74) *Attorney, Agent, or Firm* — Cermak Nakajima & McGowan LLP; Tomoko Nakajima (57) ABSTRACT

A touch panel device in which a touch panel provided with a switch display and a touch sensor having a plurality of electrodes that include a chevron-shaped portion and a valley-shaped portion and that correspond to the switch display are disposed in a stacked manner, a slide input being capable of being performed by slide operation in an arrangement direction of the electrodes, in which, among intersection angles formed by intersection between a virtual line extending in the slide operation direction and a valley bottom of the valley-shaped portion, a valley side external angle that is an external angle of each electrode is larger than, among intersection angles formed by intersection between the virtual line and a peak portion of the chevron-shaped portion, a chevron side internal angle that is an (Continued)

internal angle of each electrode, and a buried portion that raises the valley bottom is provided in each electrode.

6 Claims, 10 Drawing Sheets

(51) Int. Cl.
*G06F 3/044* (2006.01)
*H03K 17/96* (2006.01)
*G06F 3/0354* (2013.01)

(52) U.S. Cl.
CPC ....... *G06F 3/0412* (2013.01); *H03K 17/9622* (2013.01); *G06F 2203/0339* (2013.01); *G06F 2203/04111* (2013.01); *H03K 2017/9602* (2013.01)

(56) References Cited

U.S. PATENT DOCUMENTS

| | | | |
|---|---|---|---|
| 7,382,139 B2 * | 6/2008 | Mackey | G06F 3/044 324/660 |
| 8,194,035 B2 * | 6/2012 | Yoshikawa | G06F 3/044 178/18.01 |
| 2009/0266622 A1 | 10/2009 | Yoshikawa | |
| 2013/0082951 A1 | 4/2013 | Tanaka et al. | |

FOREIGN PATENT DOCUMENTS

| JP | 2011-204136 A | 10/2011 |
|---|---|---|
| JP | 2013-050866 A | 3/2013 |

* cited by examiner

TOUCH SENSOR AND TOUCH PANEL DEVICE

This application is a national phase entry under 35 U.S.C. § 371 of PCT Patent Application No. PCT/JP2014/082216, filed on Dec. 5, 2014, which claims priority under 35 U.S.C. § 119 to Japanese Patent Application No. 2013-253662, filed Dec. 6, 2013, both of which are incorporated by reference.

TECHNICAL FIELD

The present invention relates to a touch sensor and a touch panel device on which a slide input by contact of a fingertip and the like can be performed.

BACKGROUND ART

As a touch panel device, a capacitance type touch panel device in which a touch panel on which a switch screen is displayed on the front, and a touch sensor provided with a plurality of electrode corresponding to the switch are disposed to overlap each other is known. When an operator abuts a finger against the switch screen, since the capacitance of the electrode that is disposed at the contact portion changes, the change in capacitance is detected by a control means.

In such a touch panel device, the plurality of electrodes are disposed so as to be arranged on a straight line, a curved line, or a circumference enabling slide input to be performed by successive finger contact with the electrodes such that, for example, a level of a sound volume or an air volume of a device can be changed. As a shape of such electrodes, for example, Japanese Unexamined Patent Application Publication No. 56-001438 (Patent Literature 1) describes a double chevron electrode shape that has two chevron-shaped portions, which are called a finger portion, in a single electrode. Furthermore, Japanese Unexamined Patent Application Publication No. 2011-204136 (Patent Literature 2) describes a single chevron electrode shape that has a single chevron-shape in a single electrode.

CITATION LIST

Patent Literature

PTL 1: Japanese Unexamined Patent Application Publication No. 56-001438
PTL 2: Japanese Unexamined Patent Application Publication No. 2011-204136

SUMMARY OF INVENTION

Technical Problem

In touch panel devices on which slide input can be performed, as the size of the electronic device in which the touch panel device is installed becomes smaller or as the size of the touch panel itself becomes smaller, the area in which the switch to perform slide input is disposed becomes smaller. As a result, since the area of each electrode configuring the switch becomes smaller, detection of the change in capacitance when a finger is slid thereon becomes difficult. Accordingly, facilitation of detection of the change in capacitance is required without changing the position of the outer edge occupied by the slide switch and the number of electrodes configuring the slide switch.

Solution to Problem

In order to achieve the objective described above, a touch panel device is provided that includes a touch panel provided with a switch display; a touch sensor provided with a plurality of electrodes that include a chevron-shaped portion and a valley-shaped portion and that correspond to the switch display; the touch panel and the touch sensor being disposed in a stacked manner; and a slide input being capable of being performed by slide operation in an electrode arrangement direction, in which among intersection angles formed by intersection between a virtual line extending in the slide operation direction and a valley bottom of the valley-shaped portion, a valley side external angle B that is an external angle of each electrode is larger than, among intersection angles formed by intersection between the virtual line and a peak portion of the chevron-shaped portion, a chevron side internal angle A that is an internal angle of each electrode.

Since the touch panel provided with the switch display and the touch sensor having the plurality of electrodes that include the chevron-shaped portion and the valley-shaped portion and that correspond to the switch display are disposed in a stacked manner, the touch panel and the touch sensor can be manufactured separately, and both can be assembled with each other when manufacturing the touch panel device. Accordingly, the touch panel and the touch sensor can be manufactured on different lines.

Since the touch sensor is provided with a plurality of electrodes that include a chevron-shaped portion and a valley-shaped portion and that correspond to the switch display, the touch panel device is capable of a slide input that is performed by slide operation in the electrode arrangement direction.

Among intersection angles formed by intersection between a virtual line extending in the slide operation direction and a valley bottom of the valley-shaped portion, a valley side external angle B that is an external angle of each electrode is larger than, among intersection angles formed by intersection between the virtual line and a peak portion of the chevron-shaped portion, a chevron side internal angle A that is an internal angle of each electrode; accordingly, compared with a case in which there is no such conditions, it is possible to increase the area of each electrode while the size of the outer edge occupying the slide switch, that is, the size in which the slide switch occupies, is fixed. Accordingly, detection of change in capacitance is facilitated.

A buried portion that raises the valley bottom of the valley-shaped portion can be provided in each electrode. Since the buried portion that raises the valley bottom of the valley-shaped portion is provided in the electrode, an area occupied by an electrode can be increased and, furthermore, distance in the slide operation direction from a peak portion of an adjacent electrode can be made short. Accordingly, change in capacitance can be detected greatly and detection with high sensitivity becomes possible.

A filling portion that shortens a distance in the slide operation direction from a peak portion of the chevron-shaped portion of an adjacent electrode may be provided in an outer edge forming the chevron-shaped portion or the valley-shaped portion of each electrode. Since the filling portion that shortens the distance in the slide operation direction from a peak portion of the chevron-shaped portion of an adjacent electrode is provided in an outer edge forming the chevron-shaped portion or the valley-shaped portion of each electrode, the distance between the electrodes can be shortened by the amount corresponding to the end portion of the electrode; accordingly, even when slide operation that is deviated from the center of the electrode is performed at the edge of the electrode, detection of change in capacitance is facilitated.

The valley side external angle B may be substantially rectangular as a mode of having, among intersection angles formed by intersection between a virtual line extending in the slide operation direction and a valley bottom of the valley-shaped portion, a valley side external angle B that is an external angle of each electrode to be larger than, among intersection angles formed by intersection between the virtual line and a peak portion of the chevron-shaped portion, a chevron side internal angle A that is an internal angle of each electrode. Since the valley side external angle B is substantially rectilinear, the distance from a peak portion of an adjacent electrode can be made short. Furthermore, a buried portion may be provided.

The touch panel and the touch sensor may be are formed of the same resin film and are integral with respect to each other. Since the touch panel and the touch sensor are formed of the same resin film and are integral with respect to each other, the touch panel and the touch sensor can be formed with a single member, and reduction in material cost can be achieved. Furthermore, no problem in positioning the touch panel and the touch sensor with respect to each other will occur when manufacturing the touch panel and the touch sensor separately, and manufacturing of the touch panel device is facilitated.

Furthermore, a touch sensor is provided including a plurality of electrodes having a chevron-shaped portion and a valley-shaped portion, a slide input being capable of being performed by slide operation in an arrangement direction of the plurality of electrodes, in which, among intersection angles formed by intersection between a virtual line extending in the slide operation direction and a valley bottom of the valley-shaped portion, a valley side external angle B that is an external angle of each electrode is larger than, among intersection angles formed by intersection between the virtual line and a peak portion of the chevron-shaped portion, a chevron side internal angle A that is an internal angle of each electrode.

Since the touch sensor is provided with a plurality of electrodes that corresponds to the switch display and that includes the chevron-shaped portion and the valley-shaped portion, slide input can be performed by slide operation in the arrangement direction of the electrodes.

Furthermore, since the electrode is shaped such that among intersection angles formed by intersection between the virtual line extending in the slide operation direction and the valley bottom of the valley-shaped portion, the valley side external angle B that is the external angle of each electrode is larger than, among intersection angles formed by intersection between the virtual line and a peak portion of the chevron-shaped portion, the chevron side internal angle A that is the internal angle of each electrode, compared with a case having no such conditions, the size of each electrode can be larger while the size of the outer edge occupying the slide switch, that is, the size the slide switch occupies, is fixed. Accordingly, detection of change in capacitance is facilitated.

Advantageous Effects of Invention

In the touch sensor or the touch panel device of the present invention, detection of the change in capacitance is facilitated.

Furthermore, the touch sensor or the touch panel device of the present invention is capable of detecting the change in capacitance with good sensitivity upon contact of a finger and the like.

DESCRIPTION OF EMBODIMENTS

The present invention will be described in further detail with reference to embodiments. Components that are common among each embodiments will be attached with the same reference numerals and redundant description thereof will be omitted. Furthermore, redundant descriptions of common materials, manufacturing methods, effects, and the like will be omitted as well.

First Embodiment [FIGS. 1 to 5]

Figure 1:
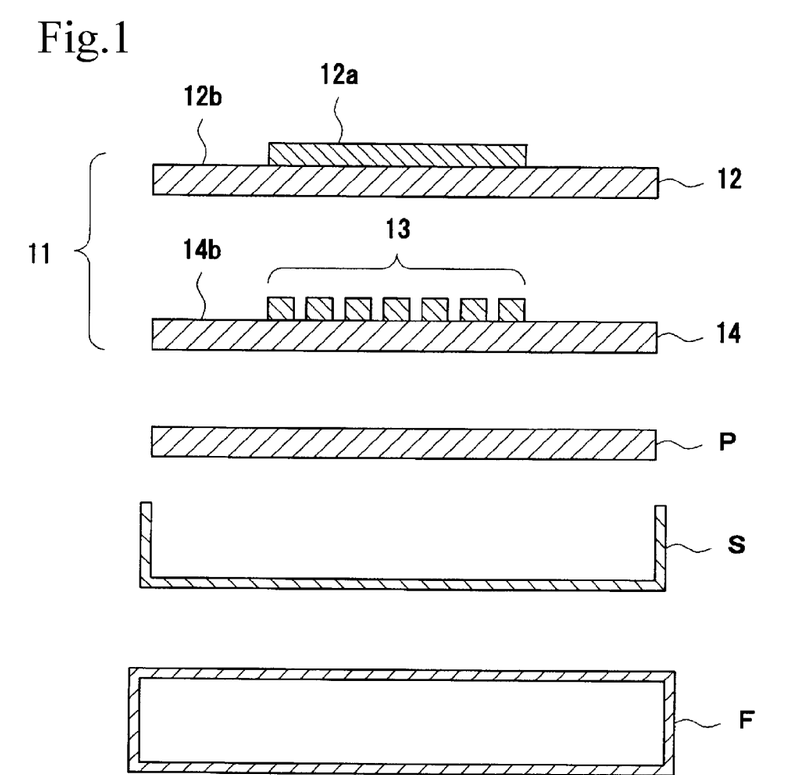
FIG. 1 is a schematic exploded cross-sectional view of a touch panel device that is an embodiment.

A touch panel device 11 of the present embodiment includes a touch panel 12 in which a switch display is provided, and a touch sensor 14 provided with a plurality of electrodes 13 corresponding to the switch display, and is configured by installing, as required, a circuit substrate P, a support panel S, and the like in a housing F. FIG. 1 illustrates a configuration of the touch panel device 11.

Figure 2:
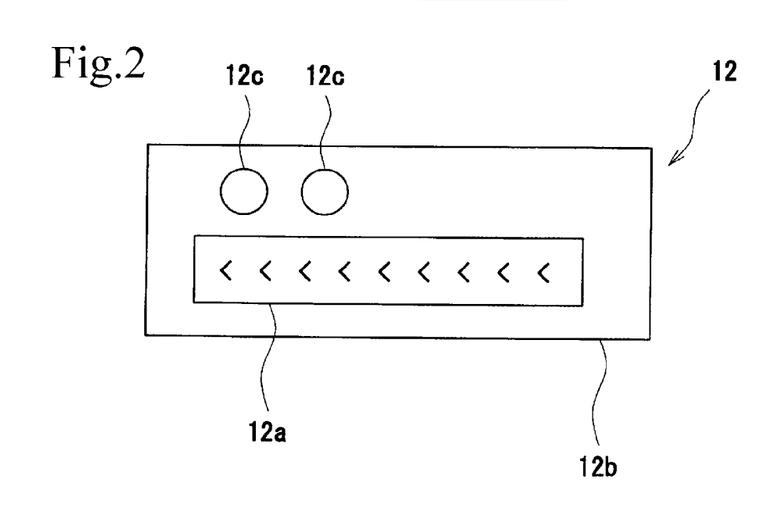
FIG. 2 is a plan view of the touch panel of FIG. 1.

The touch panel 12 displays an operation screen for an operator to perform a switch operation and includes a thin resin film portion on which a slide switch input unit (the switch display) 12a for performing at least a slide input is printed. As long as there is such a resin film portion, as illustrated in FIG. 2, the entire touch panel 12 may be formed of a thin resin film 12b with a predetermined shape and the portions other than the slide switch input unit 12a may be formed of a thick resin material.

Furthermore, other than the slide switch input unit 12a, a plurality of touch switch input units 12c for merely performing on and off of a predetermined function and for switching modes may be provided on the surface of the touch panel 12.

Figure 3:
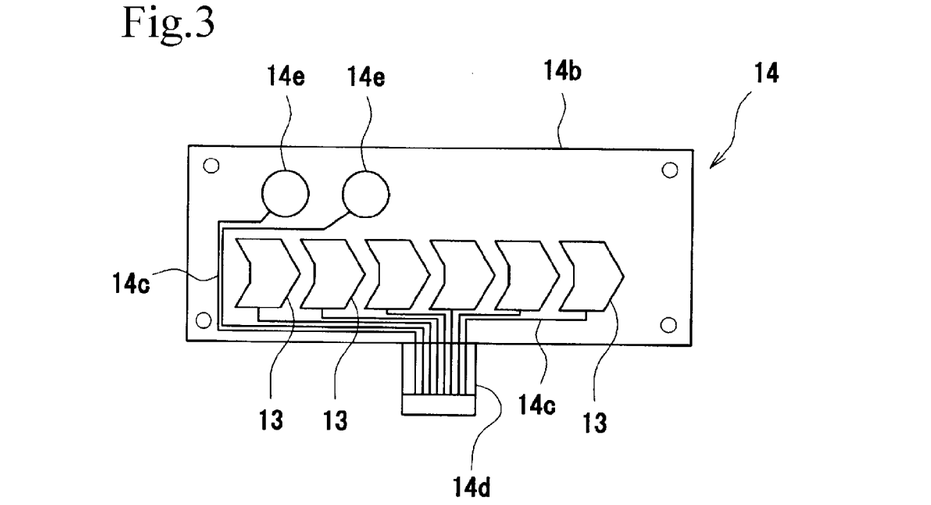
FIG. 3 is a plan view of a touch sensor of FIG. 1.

As illustrated in FIG. 3, the touch sensor 14 is a unit in which a plurality of electrodes 13 corresponding to the slide input on a resin film 14b are disposed in parallel. Wires 14c are attached to the electrodes 13, and the wires 14c are connected to a connector 14d provided at an end portion of the resin film 14b.

Note that when touch switches are provided, electrodes 14e for the touch switches corresponding to the touch switches are included.

Figure 4:
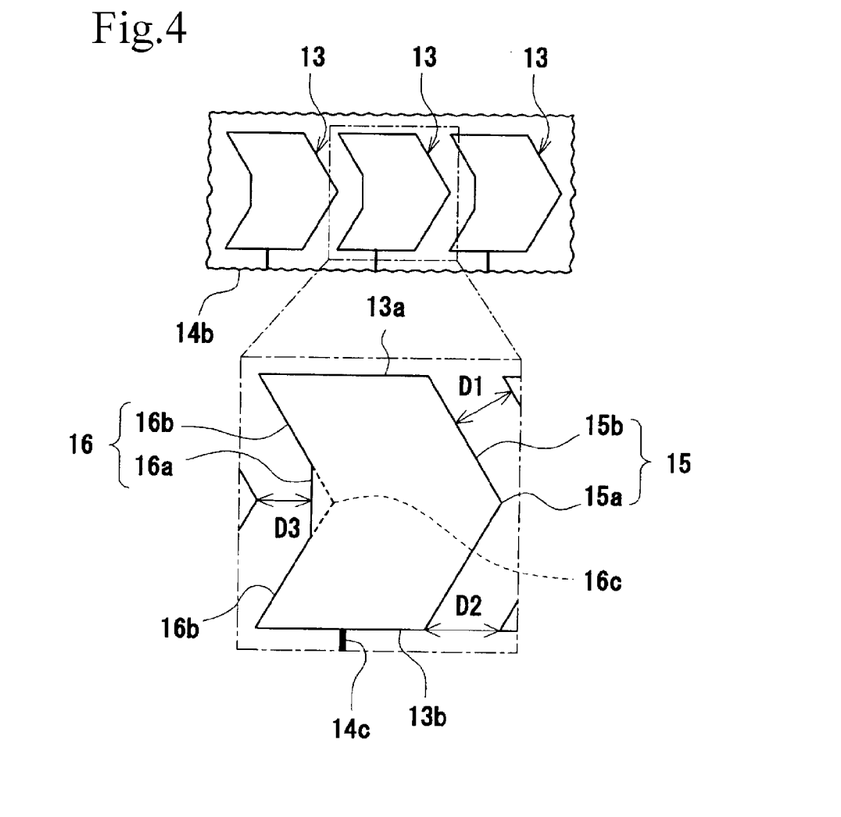
FIG. 4 is a partially enlarged plan view of an electrode included in the touch sensor of FIG. 1.

A state in which the electrodes 13 are arranged is illustrated in FIG. 4. The electrodes 13 are disposed successively in a slide operation direction with a gap in between, and an electrode 13 includes a chevron-shaped portion 15 having a peak portion 15a that protrudes towards the outside of the electrode 13, and a valley-shaped portion 16 having a valley bottom 16a recessed towards the inside thereof. Furthermore, the chevron-shaped portion 15 and the valley-shaped portion 16 of one electrode 13 and an adjacent electrode 13 face each other. The one electrode 13 and the adjacent electrode 13 are adjacent to each other in such a manner that the chevron-shaped portion 15 of the adjacent electrode 13 is inside the valley-shaped portion 16 of the one electrode 13.

Figure 5:
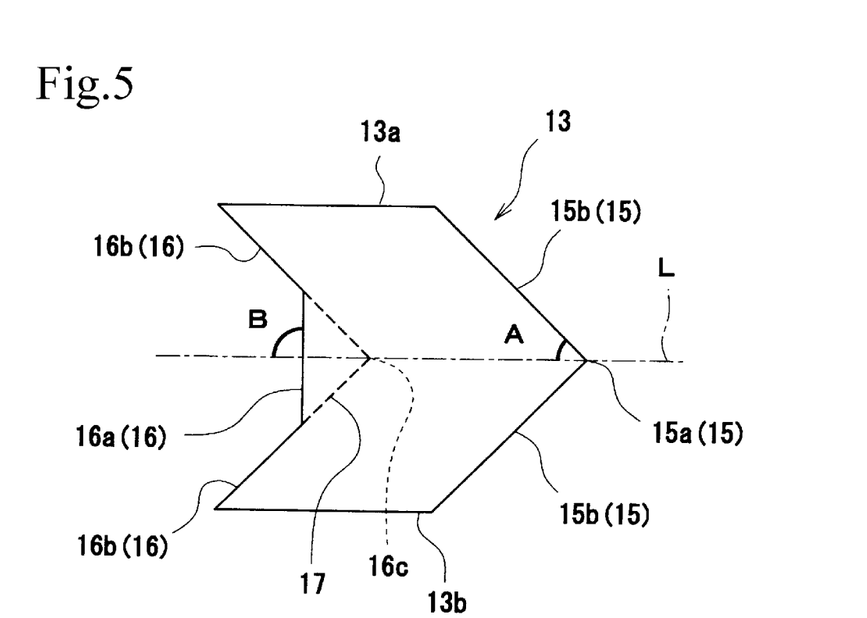
FIG. 5 is an enlarged plan view of an electrode of FIG. 1.

FIG. 5 illustrates an enlarged electrode 13. The electrode 13 includes a buried portion 17 that is a raised valley bottom 16a of the valley-shaped portion 16. The buried portion 17 is formed in such a state that a virtual valley bottom 16c that is formed by extending tangential lines that have the largest angle value, among the tangential lines of the outer edges 16b of the electrode 13 forming the valley-shaped portion 16, towards the inside is buried, and the buried portion 17 is raised from the virtual valley bottom 16c to the position of the valley bottom 16a.

A virtual line L extending in the slide operation direction is imagined. As illustrated in FIG. 5, among the intersection angles formed by the intersection between the virtual line L and the valley bottom 16a of the valley-shaped portion 16 at the center of the valley bottom 16a, a valley side external angle B, which is an external angle of the electrode 13, is larger than a chevron side internal angle A that is an internal angle of the electrode 13 among the intersection angles formed at the virtual line L and the chevron-shaped portion 15 at the peak portion 15a of the chevron-shaped portion 15. That is, while the chevron side internal angle A is an acute angle, the valley side external angle B is substantially 90 degrees, and a relationship of valley side external angle B>chevron side internal angle A holds true.

By providing the buried portion 17 such that valley side external angle B>chevron side internal angle A, the area of each electrodes 13 is increased and the amount of change in capacitance can be increased.

As illustrated in FIG. 4, regarding the distances between the electrodes 13, distance D1 is a distance between an outer edge 15b of the chevron-shaped portion 15 of an electrode 13 and an outer edge 16b of the valley-shaped portion 16 of an adjacent electrode 13, distance D2 is a distance between an upper portion 13a (or a lower portion 13b) of an electrode 13 and an upper portion 13a (or a lower portion 13b) of an adjacent electrode 13, and distance D3 is a distance between a peak portion 15a of an electrode 13 and a valley portion 16a of an adjacent electrode 13. As such, it is preferable that the distances D1, D2, and D3 between the electrodes 13 are 0.5 mm to 2.0 mm. It is because, when it is shorter than 0.5 mm, print formation will be difficult, and when it is longer than 2.0 mm, detection of successive operation with a finger or the like will be difficult.

Figure 6:
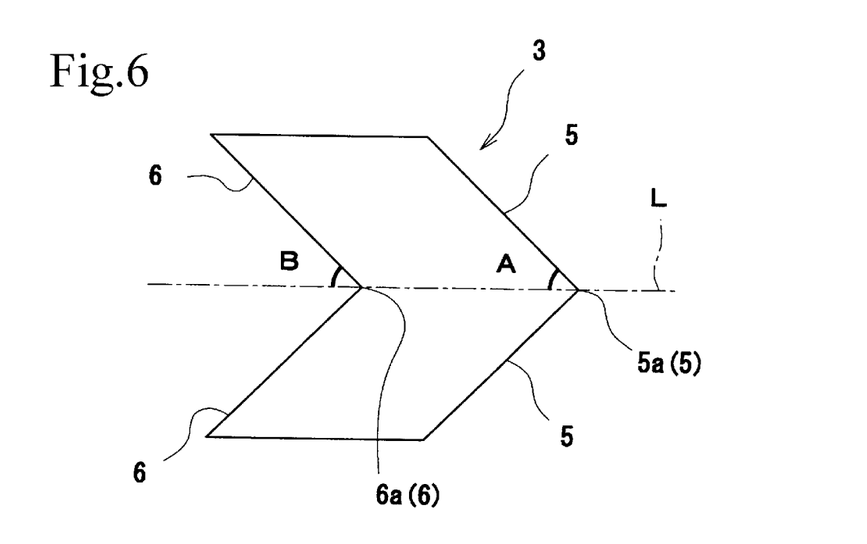
FIG. 6 is an enlarged plan view of a conventional electrode that serves as a comparison of the electrode in FIG. 5.

On the other hand, FIG. 6 illustrates a conventional type of electrode 3 that does not have the buried portion 17. In the conventional type of electrode 3, the valley side external angle B that is the external angle of the electrode 3 among the intersection angles between a valley-shaped portion 6 and the virtual line L is substantially equivalent to the chevron side external angle A that is the internal angle of the electrode 3 among the intersection angle between the virtual line L and a chevron-shaped portion 5. Accordingly, the amount of change in capacitance cannot be increased.

Furthermore, the distances D1, D2, and D3 between the electrodes 3 are long especially in the distance D3 between valley bottoms 6a of the electrodes 3 and the distance D2 between the end portions of the electrodes 13; accordingly, detection of the change in capacitance is difficult.

Figure 7:
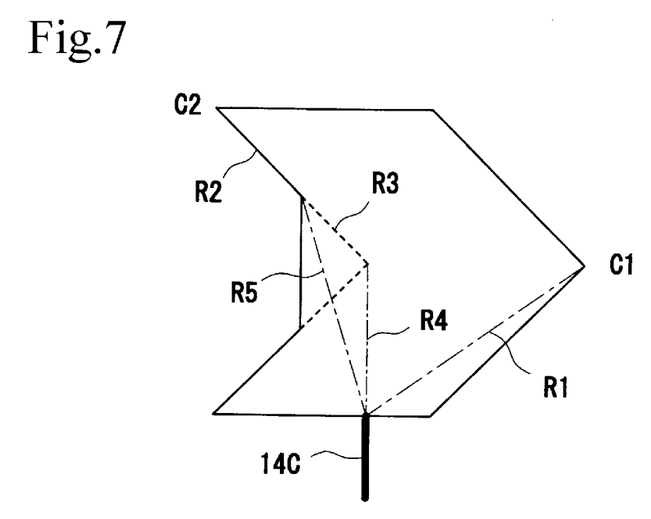
FIG. 7 is an explanatory drawing describing distances from an end portion of the electrode in FIGS. 5 and 6 to a wire.

Furthermore, regarding a wire 14c that is drawn out from the upper portion 13a or the lower portion 13b of the electrode 13, the conduction distance from the end portion of the chevron-shaped portion 15 to the wire 14c is made short; accordingly, change in capacitance can be detected greatly. Referring to FIG. 7, specific description will be given. In the conventional type of electrode 3, the shortest distance from an end portion C1 to the wire 14c is R1, and in the electrode 13 as well, the shortest distance from the end portion C1 to the wire 14c is R1 and is the same. However, the shortest distance of the electrode 3 from an end portion C2 to the wire 14c is R2+R3+R4, while the shortest distance of the electrode 13 from the end portion C2 to the wire 14c is R2+R5 and such that the shortest distance of the electrode 13 from the end portion C2 to the wire 14c is shorter. Accordingly, change in capacitance can be detected greatly.

Figure 8:
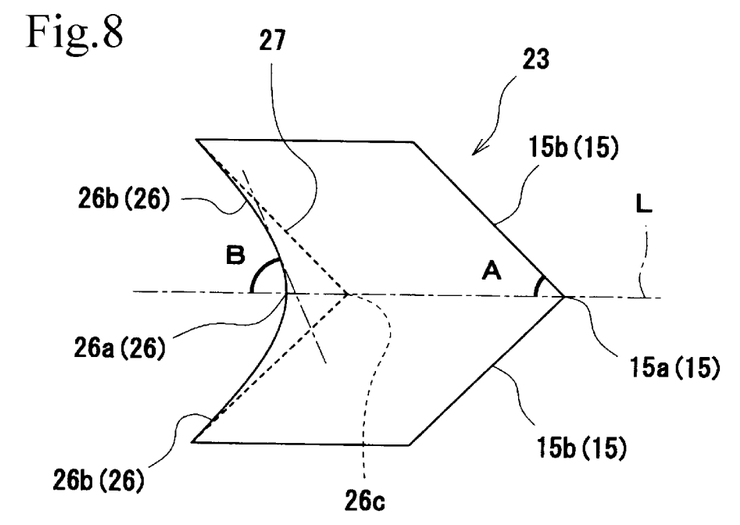
FIG. 8 is an enlarged plan view illustrating a modification of the electrode set forth in FIG. 5.
Figure 9:
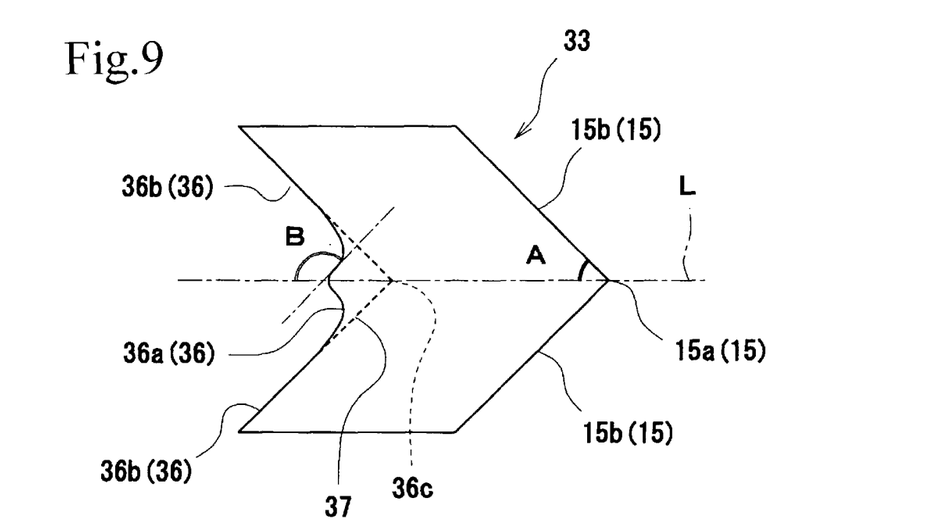
FIG. 9 is an enlarged plan view illustrating another modification of the electrode set forth in FIG. 5.

FIGS. 8 and 9 illustrate modifications of the electrode 13.

In an electrode 23 illustrated in FIG. 8, a valley-shaped portion 26 is provided with a curved recessed line-shaped outer edges 26b. In the above shape of the electrode 23 as well, the relationship valley side external angle B>chevron side internal angle A holds true. The above is because it is apparent that the tangential line of the outer edge 26b at a valley bottom 26a of the valley-shaped portion 26 intersects the virtual line L orthogonally and is larger than the chevron side internal angle A, and although the intersection angle between the tangential line of the outer edge 26b and the virtual line L becomes smaller as it becomes farther away from the valley bottom 26a, the intersection angle is always larger than the chevron side internal angle A. Additionally, a buried portion 27 is formed so as to include the valley bottom 26a that is raised with respect to a virtual valley bottom 26c that is formed by extending tangential lines that have the largest angle value, among the tangential lines of the outer edges 26b of the electrode 23 forming the valley-shaped portion 26, towards the inside.

In an electrode 33 illustrated in FIG. 9, a valley-shaped portion 36 is provided with a protrusion having a curved recessed line-shaped outline. In the electrode 33 as well, among the intersection angles formed by the intersection between the virtual line L extending in the slide operation direction and the valley-shaped portion 36, the valley side external angle B, which is an external angle of the electrode 33, is larger than the chevron side internal angle A that is an internal angle of the electrode among the intersection angles formed at the virtual line L and the chevron-shaped portion 15 at the peak portion 15a of the chevron-shaped portion 15.

Furthermore, a buried portion 37 is formed so as to include a valley bottom 36a that is raised with respect to a virtual valley bottom 36c that is formed by extending tangential lines that have the largest angle value, among the tangential lines of the outer edges 36b forming the valley-shaped portion 36, towards the inside.

The resin film 12b used for the touch panel 12 and the resin film 14b used for the touch sensor 14 may be a transparent resin film, such as polyethylene terephthalate, polycarbonate, or polyurethane, and the electrodes 13, 23, and 33 may be formed by printing with conductive ink. The wires 14c can also be formed with conductive ink or a silver paste.

Stacking of the touch panel 12 and the touch sensor 14 can be performed when positioning the touch panel 12 and the touch sensor 14 upon installation in the housing F, and the touch panel 12 and the touch sensor 14 may be adhered to each other with an adhesive tape or an adhesive.

Note that in the present embodiment, the touch panel 12 and the touch sensor 14 have been formed of separate resin films; however, the touch panel 12 and the touch sensor 14 can be formed of a single member by, for example, forming the electrodes 13, 23, and 33 on a single resin film and by print forming the slide input unit 12a with a stacked transparent resin film in between.

Such a touch sensor 13 is used by being connected to a circuit analysis unit (not shown) including an IC chip and the like through the connector 14d.

Figure 10:
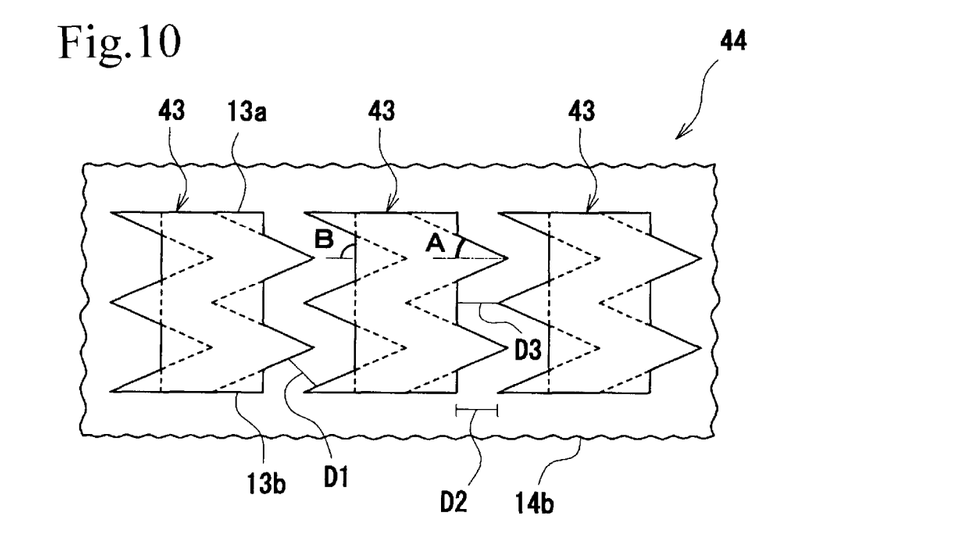
FIG. 10 is a plan view of an electrode of another embodiment corresponding to an electrode set forth in FIG. 4.
Figure 11:
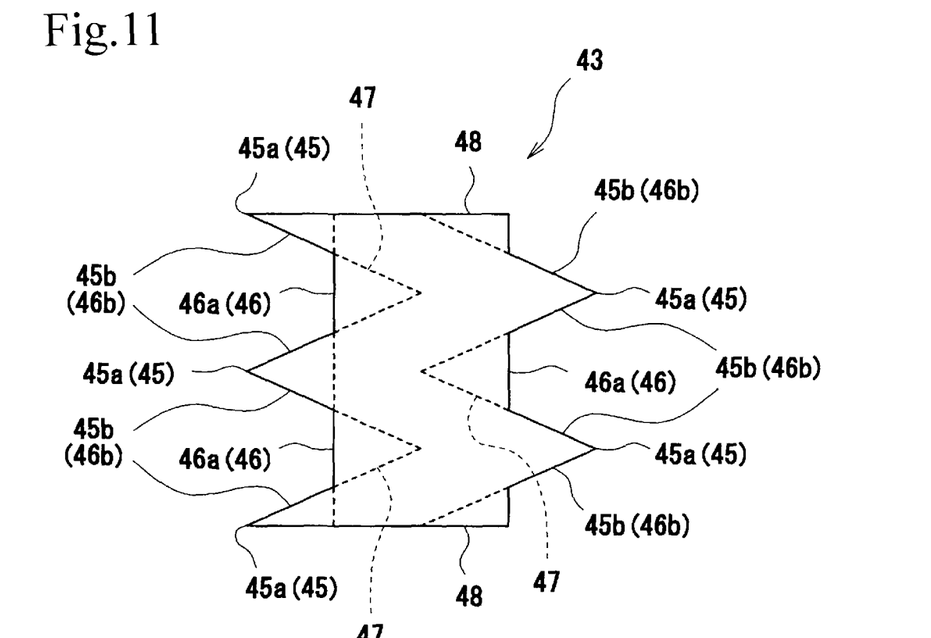
FIG. 11 is an enlarged plan view of an electrode of FIG. 10.

Second Embodiment [FIGS. 10 and 11]

Compared with the touch sensor 14 set forth in the previous embodiment, a touch sensor 44 of the present embodiment has a different electrode shape. A state in which electrodes 43 provided in the touch sensor 44 are arranged is illustrated in FIG. 10, and an enlarged plan view of an electrode 43 is illustrated in FIG. 11. In the electrode 43, a chevron-shaped portion 45 and a valley-shaped portion 46 are provided in plural numbers in a single electrode 43. Accordingly, the chevron-shaped portions 45 and the valley-shaped portions 46 are presented successively and outer edges 45b of the chevron-shaped portions 45 and outer edges 46b of the valley-shaped portions 46 have common portions.

By shaping the electrodes 43 in the above manner, even if the slide operation with a finger and the like is vertically displaced with respect to the center of the electrodes 43, the slide input can be detected in a favorable manner.

Similar to the electrode 13 set forth in the previous embodiment, in the electrode 43, the valley side external angle B that is an external angle of the electrode 43 among the intersection angles between the valley-shaped portion 46 and the virtual line L extending in the slide operation direction is set larger than the chevron side internal angle A that is an internal angle of the electrode 43 among the intersection angles between the chevron-shaped portion 45 and the virtual line L. In other words, buried portions 47 that raise valley bottoms 46a of the valley-shaped portions 46 are provided. By doing so, the distances D3 between peak portions 45a of the chevron-shaped portions 45 and the valley bottoms 46a of the valley-shaped portions 46, which are distances between the electrodes 43, are shortened, and the area and the amount of change in capacitance of each electrode 43 are increased.

Furthermore, in the present embodiment, in the outer edges 45b, 46b forming the chevron-shaped portions 45 or the valley-shaped portions 46 of an electrode 43, filling portions 48 that shorten the distance D2 in the slide operation direction from the peak portions 45a of another electrode 43 adjacent to the above electrode 43 are provided.

By providing the filling portions 48, the distances D2 between the electrodes 43 at the ends of the electrodes 43 are shortened, the area and the amount of change in capacitance of each electrode 43 are increased.

Figure 12:
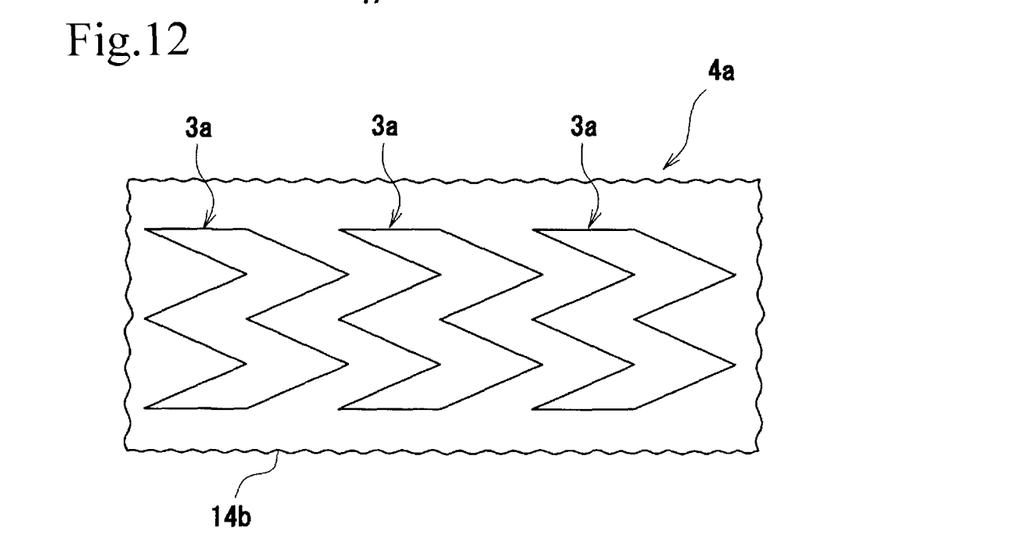
FIG. 12 is a plan view of a conventional electrode, which corresponds to FIG. 10, that serves as a comparison of the electrode in FIG. 10.

FIG. 12 illustrates electrodes 3a of a touch sensor 4a of a conventional type. It can be seen that the area of each electrode 43 is larger than the area of each electrode 3a. Furthermore, it can be seen that the distances D2 and D3 between the electrodes 43 are shorter.

Figure 13:
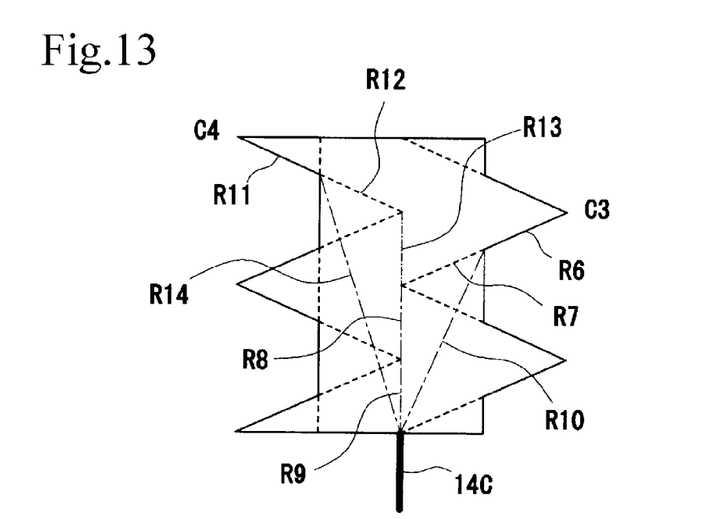
FIG. 13 is an explanatory drawing describing distances from an end portion of the electrode in FIGS. 11 and 12 to a wire.

Furthermore, regarding the wire 14c that is drawn out from the upper portion 13a or the lower portion 13b of the electrode 43, the conduction distance from the end portion of the chevron-shaped portion 45 to the wire 14c is made short; accordingly, change in capacitance can be detected greatly. Referring to FIG. 13, specific description will be given. In the conventional type of electrode 4a, the shortest distance from an end portion C3 to the wire 14c is R6+R7+R8+R9, while the shortest distance from an end portion C3 of the electrode 43 to the wire 14c is R6+R10. The electrode 43 has a shorter shortest distance. Furthermore, when comparing the shortest distance from another end portion C4 to the wire 14c, while it is R11+R12+R13+R8+R9 in the case of the conventional type of electrode 4a, it is R11+R14 in the case of the electrode 43. Accordingly, it can be understood that the electrode 43 has a shorter distance from the end portion C4 to the wire 14c. Accordingly, the electrode 43 is capable of detecting the change in capacitance in a great manner.

Figure 14:
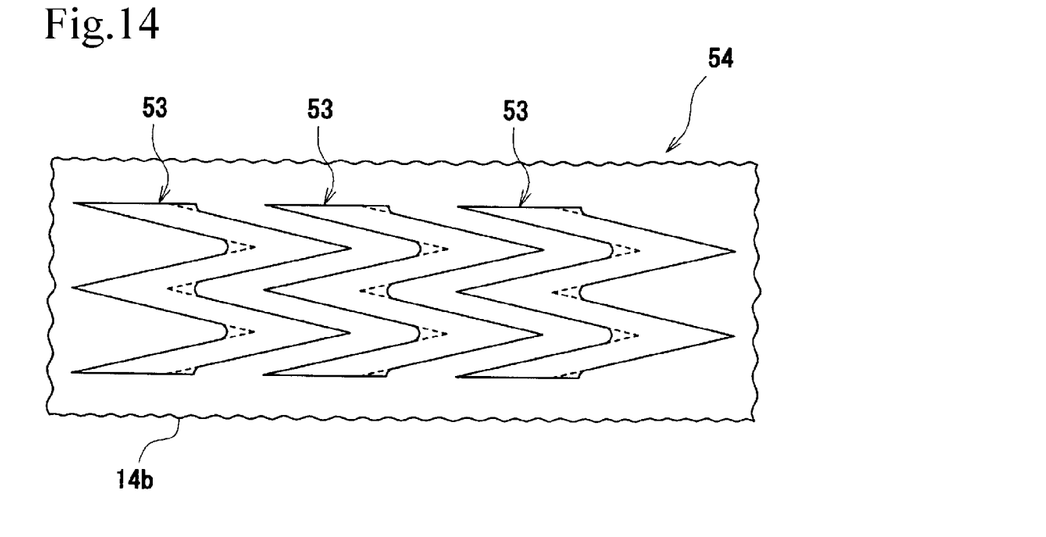
FIG. 14 is a plan view of an electrode of another embodiment corresponding to an electrode set forth in FIG. 4.
Figure 15:
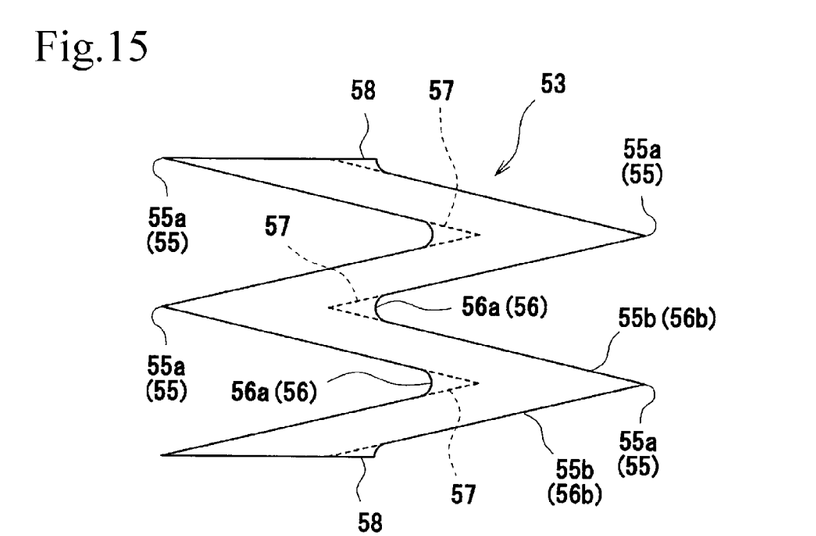
FIG. 15 is an enlarged plan view of an electrode of FIG. 14.

Third Embodiment [FIGS. 14 and 15]

Compared with the touch sensor 44 set forth in the previous embodiment, a touch sensor 54 of the present embodiment has a different electrode shape. A state in which electrodes 53 provided in the touch sensor 54 are arranged is illustrated in FIG. 14, and an enlarged plan view of an electrode 53 is illustrated in FIG. 15.

In the electrodes 53, outer edges 55b and 56b of chevron-shaped portions 55 and valley-shaped portions 56 of each electrode 53 are sharply and steeply formed such that adjacent electrodes 53 deeply enter each other. Furthermore, surface shapes of buried portions 57 include, similar to the electrode 23 illustrated in FIG. 8, curved recessed line-shaped bottom portions 56a.

In the electrode 53 as well, the valley side external angle B that is an external angle of the electrode 53 among the intersection angles between the valley-shaped portion 56 and the virtual line L extending in the slide operation direction is set larger than the chevron side internal angle A that is an internal angle of the electrode 53 among the intersection angles between the chevron-shaped portion 55 and the virtual line L. Furthermore, buried portions 57 that raise valley bottoms 56a of the valley-shaped portions 56 are provided. Furthermore, in the outer edges 55b, 56b forming the chevron-shaped portions 55 or the valley-shaped portions 56 of the electrode 53, filling portions 58 that shorten the distance D2 in the slide operation direction from the peak portions 55a of an adjacent electrode 53 are provided.

By providing such buried portions 57, the distances D3 between the peak portions 55a of the chevron-shaped portions 55 and the valley bottoms 56a of the valley-shaped portions 56 are shortened, and by providing the filling portions 58, the distances D2 between the electrodes 53 at the ends of the electrode 53 are shortened. Furthermore, the area of each electrode 53 is increased and the amount of change in capacitance is increased.

Figure 16:
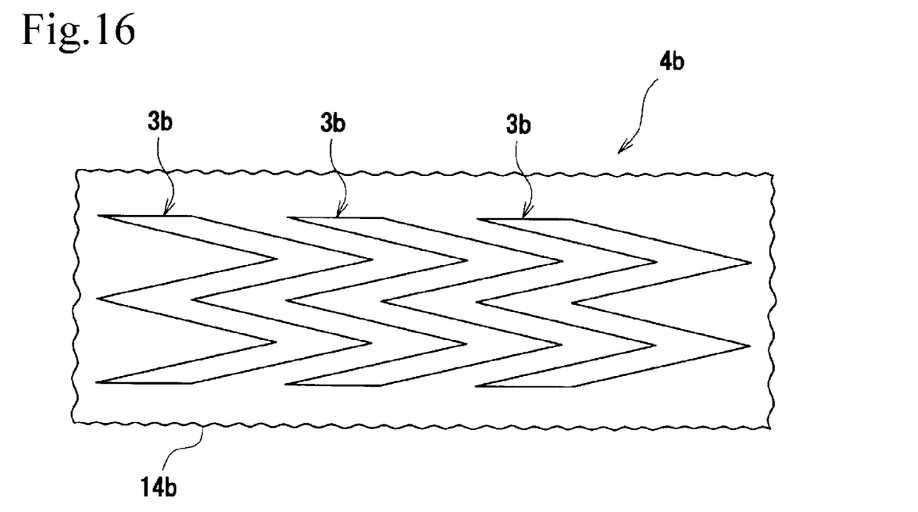
FIG. 16 is a plan view of a conventional electrode, which corresponds to FIG. 10, that serves as a comparison of the electrode in FIG. 14.

In FIG. 16, electrodes 3b provided in a touch sensor 4b of the conventional type is illustrated. Compared with the electrodes 3b of the conventional type, the distances D2 and D3 between the adjacent electrodes 53 are short in the electrodes 53 and the interference between the electrodes 53 is large; accordingly, the change in capacitance when sliding operation is performed can be made to change successively.

Figure 17:
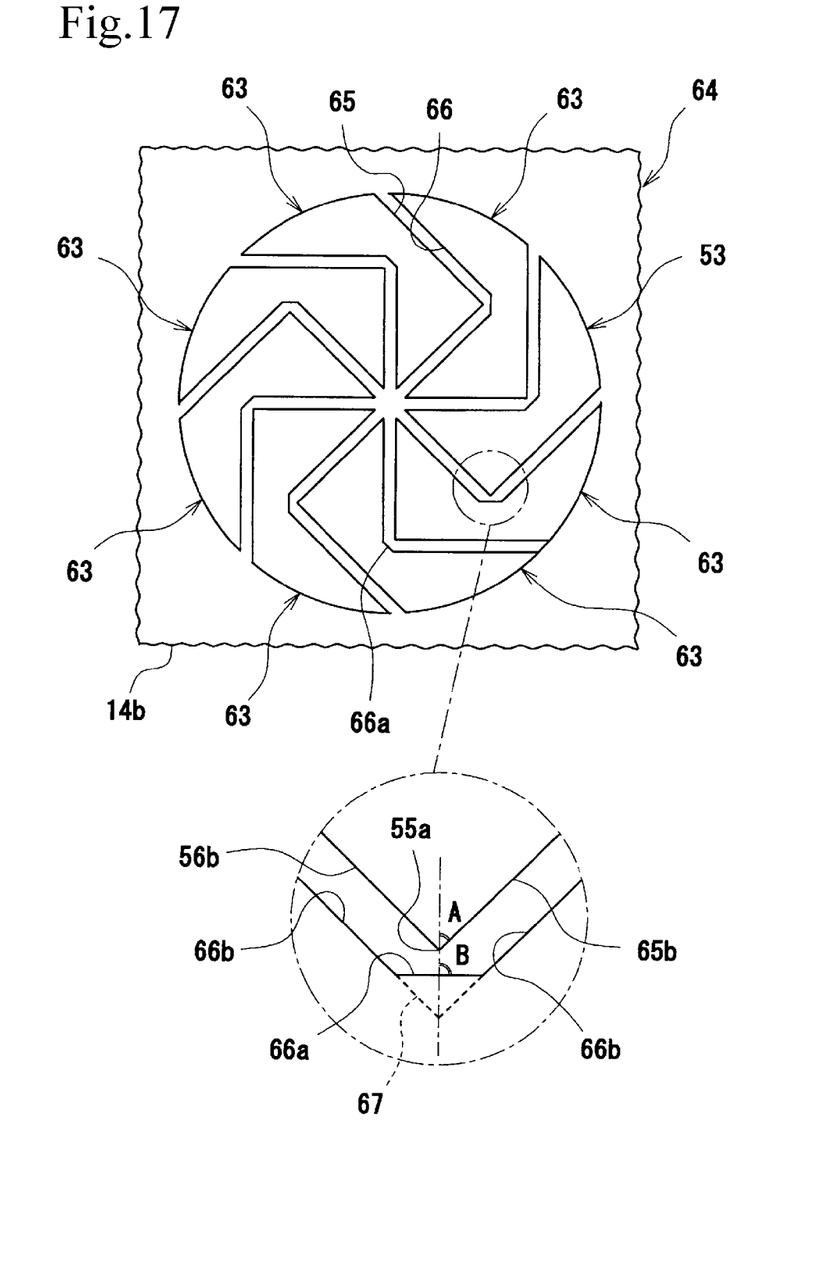
FIG. 17 is a plan view of an electrode of further another embodiment.

Fourth Embodiment [FIG. 17]

In the embodiments hitherto, touch sensors in which slide operation is performed on a straight line by disposing the electrodes on a straight line have been set forth; however, the touch sensor may be a touch sensor 64 on which a rotational operation is performed by disposing the electrode inside a circle.

The touch sensor 64 is illustrated in FIG. 17. In such a case as well, the valley side external angle B of the valley-shaped portion 66 is set larger than the chevron side internal angle A of the chevron-shaped portion 65. In other words, valley bottoms 66a that have outline shapes that is perpendicular to the direction in which the electrodes 63 succeed (the slide operation direction) form buried portions 67 to increase the shape of the electrodes 67. By doing so, the distances D3 between peak portions 65a of the chevron-shaped portions 65 and the valley bottoms 65a of the valley-shaped portions 66, which are distances between the electrodes 63, are shortened.

Even with such a touch sensor 64, the area of each electrode 63 increases and the amount of change in capacitance can be increased.

Figure 18:
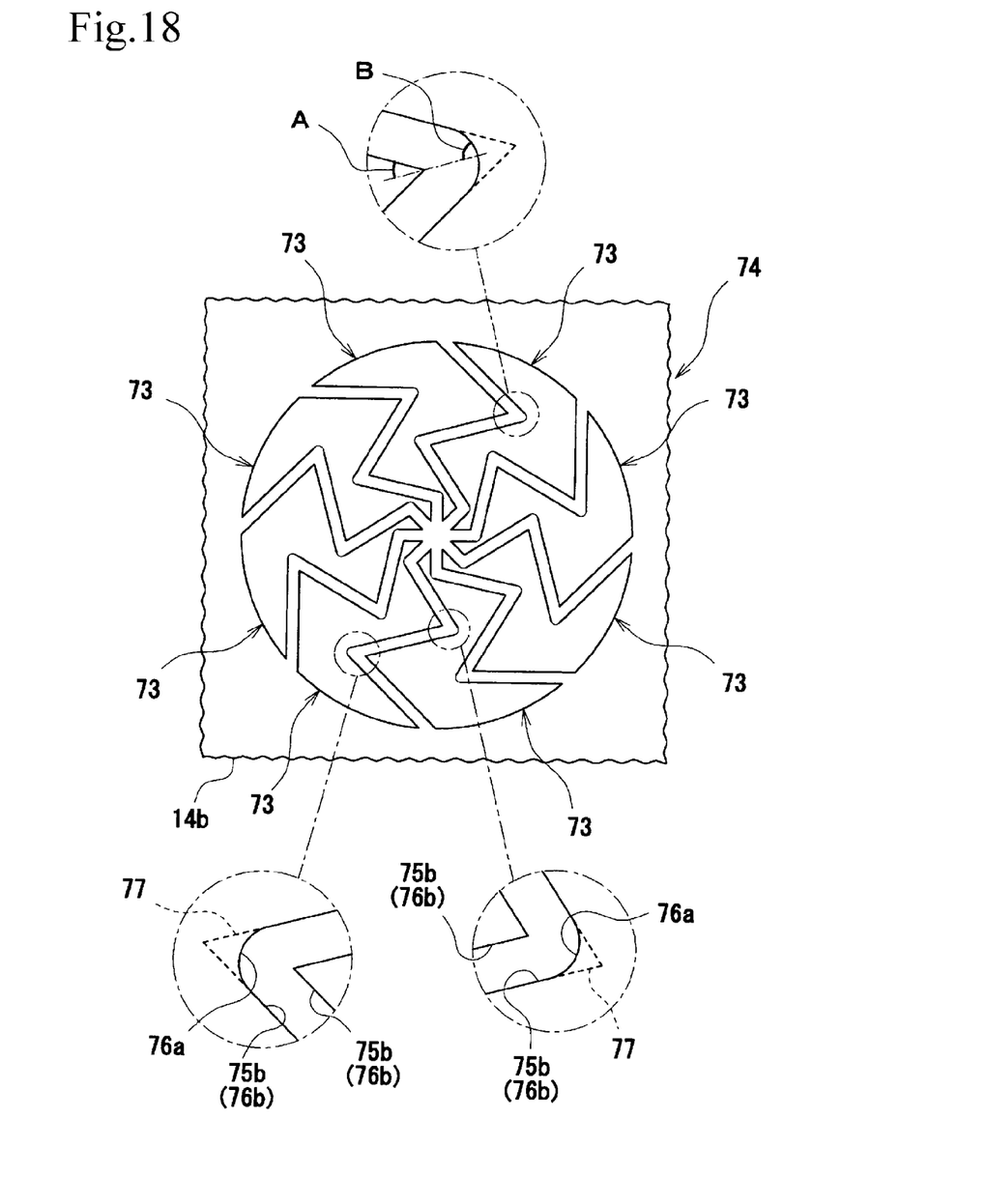
FIG. 18 is a plan view illustrating a modification of the electrode set forth in FIG. 17.

FIG. 18 illustrates an example in which electrodes 73 that are a modification of the electrode 63 are provided. As regards a touch sensor 74 illustrated in FIG. 18, since in the electrodes 73, valley side external angle B>chevron side internal angle A holds true and buried portions 77 are provided, the area of each electrode 73 increases and the amount of change in capacitance is increased.

The embodiments described above are examples and the present invention is not limited to the embodiments, and includes any modifications of the shapes, materials, the manufacturing method, and the like of each member that are within the scope of the present invention.

REFERENCE SIGNS LIST 3, 3a, 3b electrode
4, 4a, 4b touch sensor
5 chevron-shaped portion
6 valley-shaped portion
6a valley bottom
11 touch panel device
12 touch panel
12a slide switch input unit
12b resin film
12c touch switch input unit
13, 23, 33, 43, 53, 63, 73 electrode
13a upper portion
13b lower portion
14, 44, 54, 64, 74 touch sensor
14b resin film
14c wire
14d connector
14e electrode for touch switch
15, 45, 55, 65, 75 chevron-shaped portion
15a, 45a, 55a, 65a, 75a peak portion
15b, 45b, 55b, 65b, 75b outer edge
16, 23, 36, 46, 56, 66, 76 valley-shaped portion
16a, 26a, 36a, 46a, 56a, 66a, 76a valley bottom
16b, 26b, 36b, 46b, 56b, 66b, 76b outer edge
16c, 26c, 36c, 46c, 56c, 66c, 76c virtual valley bottom
17, 27, 37, 47, 57, 67, 77 buried portion
A chevron side internal angle
B valley side external angle
C1 to C4 end portion
D1 to D3 distance
R1 to R13 distance
S support panel
P circuit substrate
F housing
L virtual line

The invention claimed is:

1. A touch panel device, comprising:
a touch panel provided with a switch display;
a touch sensor provided with a plurality of electrodes that include a chevron-shaped portion and a valley-shaped portion and that correspond to the switch display;
the touch panel and the touch sensor being disposed in a stacked manner; and
a slide input being capable of being performed by slide operation in an electrode arrangement direction, wherein
among intersection angles formed by intersection between a virtual line extending in the slide operation direction and a valley bottom of the valley-shaped portion, a valley side external angle B that is an external angle of each electrode is larger than, among intersection angles formed by intersection between the virtual line and a peak portion of the chevron-shaped portion, a chevron side internal angle A that is an internal angle of each electrode.

2. The touch panel device according to claim 1, wherein a buried portion that raises the valley bottom of the valley-shaped portion is provided in each electrode.

3. The touch panel device according to claim 1, wherein a filling portion that shortens a distance in the slide operation direction from a peak portion of an adjacent electrode is provided in an outer edge forming the chevron-shaped portion or the valley-shaped portion of each electrode.

4. The touch panel device according to claim 1, wherein the valley side external angle B is substantially rectangular.

5. A touch panel device according to claim 1, wherein the touch panel and the touch sensor are formed of a same resin film and are integral with respect to each other.

6. A touch sensor comprising:
a plurality of electrodes including a chevron-shaped portion and a valley-shaped portion, a slide input being capable of being performed by slide operation in an arrangement direction of the plurality of electrodes, wherein
among intersection angles formed by intersection between a virtual line extending in the slide operation direction and a valley bottom of the valley-shaped portion, a valley side external angle B that is an external angle of each electrode is larger than, among intersection angles formed by intersection between the virtual line and a peak portion of the chevron-shaped portion, a chevron side internal angle A that is an internal angle of each electrode.

* * * * *